United States Patent
Wakabayashi et al.

(10) Patent No.: US 11,421,116 B2
(45) Date of Patent: Aug. 23, 2022

(54) ELECTROCONDUCTIVE PASTE

(71) Applicants: Fujikura Kasei Co., Ltd., Tokyo (JP); Fujikura Ltd., Tokyo (JP)

(72) Inventors: Katsutomo Wakabayashi, Kuki (JP); Yuka Azakami, Kuki (JP); Yuji Abe, Kuki (JP); Akinori Naruse, Kuki (JP); Kazutoshi Koshimizu, Sakura (JP)

(73) Assignees: Fujikura Kasei Co., Ltd., Tokyo (JP); Fujikura Ltd., Tokyo (JP)

( * ) Notice: Subject to any disclaimer, the term of this patent is extended or adjusted under 35 U.S.C. 154(b) by 0 days.

(21) Appl. No.: 17/282,537

(22) PCT Filed: Sep. 25, 2019

(86) PCT No.: PCT/JP2019/037492
§ 371 (c)(1),
(2) Date: Apr. 2, 2021

(87) PCT Pub. No.: WO2020/080049
PCT Pub. Date: Apr. 23, 2020

(65) Prior Publication Data
US 2021/0348002 A1     Nov. 11, 2021

(30) Foreign Application Priority Data
Oct. 19, 2018   (JP) .............................. JP2018-197579

(51) Int. Cl.
| | |
|---|---|
| *H01B 1/22* | (2006.01) |
| *C09D 5/24* | (2006.01) |
| *C09D 7/40* | (2018.01) |
| *C09D 7/20* | (2018.01) |
| *C09D 175/06* | (2006.01) |
| *H05K 1/09* | (2006.01) |
| *H05K 3/12* | (2006.01) |

(52) U.S. Cl.
CPC ................ *C09D 5/24* (2013.01); *C09D 7/20* (2018.01); *C09D 7/69* (2018.01); *C09D 7/70* (2018.01); *C09D 175/06* (2013.01); *H01B 1/22* (2013.01); *H05K 1/095* (2013.01); *H05K 3/1216* (2013.01)

(58) Field of Classification Search
CPC ............ H01B 1/22; H01B 1/24; B22F 1/0059
See application file for complete search history.

(56) References Cited

U.S. PATENT DOCUMENTS

| | | | | |
|---|---|---|---|---|
| 6,080,335 | A | * | 6/2000 | Ohshita ................ B22F 1/0059 |
| | | | | 252/500 |
| 6,623,663 | B2 | * | 9/2003 | Oshita ............... H01L 23/49883 |
| | | | | 156/89.18 |

FOREIGN PATENT DOCUMENTS

| | | | |
|---|---|---|---|
| CN | 102473485 A | 5/2012 | |
| EP | 0954026 A2 | 11/1999 | |
| JP | 2002097215 A | 4/2002 | |
| JP | 2005191310 A * | 7/2005 | ............... H01B 1/22 |
| JP | 2008269876 A * | 11/2008 | ............... H01B 1/24 |
| JP | 2008269876 A | 11/2008 | |
| JP | 2012043648 A | 3/2012 | |
| JP | 2012054192 A | 3/2012 | |
| JP | 2016196606 A | 11/2016 | |
| JP | 2017168438 A | 9/2017 | |
| JP | 2017183207 A | 10/2017 | |
| TW | 200808138 A | 2/2008 | |
| TW | 201617429 A | 5/2016 | |
| WO | 2014113937 A1 | 7/2014 | |
| WO | 2017164200 A1 | 9/2017 | |

OTHER PUBLICATIONS

PCT Office, International Search Report issued in PCT/JP2019/037492 mailed on Dec. 17, 2019.
Taiwan Patent Office, Office Action issued in TW 108134856 mailed on Apr. 30, 2020.
Chinese Patent Office, Office Action issued in CN 201980067792.5 dated Apr. 25, 2022.
European Patent Office, Search Report issued in EP19873065.7 dated Jun. 28, 2022.

\* cited by examiner

*Primary Examiner* — Khanh T Nguyen
(74) *Attorney, Agent, or Firm* — Wood Herron & Evans LLP

(57) ABSTRACT

An electroconductive paste according to the present invention contains a binder (A), a silver powder (B), crosslinked resin particles (C) having a glass transition temperature of 35° C. or lower, and an organic solvent (D).

20 Claims, No Drawings

ELECTROCONDUCTIVE PASTE

TECHNICAL FIELD

The present invention relates to an electroconductive paste.

Priority is claimed on Japanese Patent Application No. 2018-197579, filed Oct. 19, 2018, the content of which is incorporated herein by reference.

BACKGROUND ART

Wearable devices which are put on the body to detect a person's health condition and the like in real time have been currently developed. A circuit of the wearable device is formed of, for example, an electroconductive paste containing conductive particles and a binder resin. Wearable devices are used in close contact with the body. In particular, in cases of wearable devices embedded in clothes, the device and its circuit are required to expand and contract with the expansion and contraction of the clothes. As the electroconductive paste, a paste capable of maintaining high conductivity without an increase in electric resistance value even after repeated expansion and contraction (hereinafter, also referred to as "expansion and contraction durability") is demanded. Examples of such an electroconductive paste include those described in Patent Literatures 1 to 3.

However, in a case where the electroconductive paste contains an aqueous dispersion as described in Patent Literature 1, it has poorer printability than an organic solvent-based paste in screen printing. In addition, in a case where a buffer layer or multiple layers are formed using the electroconductive paste as described in Patent Literatures 2 and 3, the number of circuit forming steps is larger than in a case of a single layer.

CITATION LIST

Patent Literature

[Patent Literature 1]
  Japanese Unexamined Patent Application, First Publication No. 2012-54192
[Patent Literature 2]
  Japanese Unexamined Patent Application, First Publication No. 2017-183207
[Patent Literature 3]
  Japanese Unexamined Patent Application, First Publication No. 2017-168438

SUMMARY OF INVENTION

Technical Problem

The present invention is contrived in view of the above circumstances, and an object thereof is to provide an electroconductive paste capable of forming a circuit by screen printing and forming a coating film having excellent expansion and contraction durability in a single layer.

Solution to Problem

The present invention has the following aspects.

[1] An electroconductive paste containing: a binder (A); a silver powder (B); crosslinked resin particles (C) having a glass transition temperature of 35° C. or lower; and an organic solvent (D).

[2] The electroconductive paste according to [1], in which the crosslinked resin particles (C) are at least one selected from the group consisting of an acrylic crosslinked resin particle and a urethane crosslinked resin particle.

[3] The electroconductive paste according to [1] or [2], in which the binder (A) contains a polyol compound (A1) and a polyisocyanate (A2).

[4] The electroconductive paste according to any one of [1] to [3], in which the binder contains a polyester resin (A3).

[5] The electroconductive paste according to any one of [1] to [4], in which the binder (A) contains a polyol compound (A1) and a polyisocyanate (A2), and the polyol compound (A1) is at least one selected from the group consisting of a polyester polyol, a polyether polyol, a polycarbonate polyol, and a polycaprolactone polyol.

[6] The electroconductive paste according to any one of [1] to [5], in which the binder (A) contains a polyol compound (A1) and a polyisocyanate (A2), and the polyisocyanate (A2) is at least one selected from the group consisting of hexamethylene diisocyanate (HDI), diphenylmethane diisocyanate (MDI), isophorone diisocyanate (IPDI), blocked isocyanate in which hexamethylene diisocyanate (HDI) is masked with a blocking agent, blocked isocyanate in which diphenylmethane diisocyanate (MDI) is masked with a blocking agent, and blocked isocyanate in which isophorone diisocyanate (IPDI) is masked with a blocking agent.

[7] The electroconductive paste according to any one of [1] to [6], in which the binder contains a polyester resin (A3), the polyester resin (A3) is a compound obtained by reacting a dicarboxylic acid with a diol compound, the dicarboxylic acid is at least one selected from the group consisting of a succinic acid, an adipic acid, an azelaic acid, a sebacic acid, a dodecanedioic acid, a maleic acid, a fumaric acid, a glutaric acid, a hexachloroheptanedicarboxylic acid, a cyclohexanedicarboxylic acid, a phthalic acid, a hexahydrophthalic acid, an isophthalic acid, a 4-sulfoisophthalic acid, a 5-sulfoisophthalic acid, a 5-sulfoisophthalic acid sodium salt, a terephthalic acid, a tetrahydrophthalic acid, a tetrachlorophthalic acid, a 2,6-naphthalenedicarboxylic acid, a 2,7-naphthalenedicarboxylic acid, and 2,3-naphthalenedicarboxylic acid, and the diol compound is at least one selected from the group consisting of $C_2$-$C_{22}$ alkane diols such as ethylene glycol, propylene glycol, trimethylene glycol, 1,4-butylene glycol, 1,3-butylene glycol, 1,2-butylene glycol, 1,5-pentanediol, 3-methyl-1,5-pentanediol, 2,2-dimethyl-1,3-propanediol, neopentyl glycol, 1,6-hexanediol, 2,2-diethyl-1,3-propanediol, 3,3-dimethylol heptane, 2-ethyl-2-butyl-1,3-propanediol, 1,12-dodecanediol, and 1,18-octadecanediol, 2-butene-1,4-diol, 2,6-dimethyl-1-octene-3,8-diol, 1,4-cyclohexanediol, and 1,4-cyclohexanedimethanol.

[8] The electroconductive paste according to any one of [1] to [7], in which the crosslinked resin particles (C) are at least one selected from the group consisting of an acrylic crosslinked resin particle and a urethane crosslinked resin particle, the acrylic crosslinked resin particles contain a polymer obtained by polymerizing a monomer component containing an acrylic monomer in the presence of a crosslinking agent, the crosslinking agent is at least one selected from the group consisting of trimethylolpropane triacrylate, ethylene glycol dimethacrylate, diethylene glycol dimethacrylate, triethylene glycol dimethacrylate, decaethylene glycol dimethacrylate, pentadecaethylene glycol dimethacrylate, pentacontaheptaethylene glycol dimethacrylate, 1,3-butylene dimethacrylate, allyl methacrylate, trimethylolpropane trimethacrylate, pentaerythritol tetraacrylate, divinylbenzene, divinylnaphthalene, N,N-divinylaniline, divinyl ether, divinyl sulfide, divinyl sulfonic acid, polybutadiene, and polyisoprene unsaturated polyester, and the acrylic monomer is at least one selected from the group consisting of methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth)acrylate, 2-methoxyethyl (meth)acrylate, 2-ethoxyethyl (meth)acrylate, 2-(n-propoxy)ethyl (meth)acrylate, 2-(n-butoxy)ethyl (meth)acrylate, 3-methoxypropyl (meth)acrylate, 3-ethoxypropyl (meth)acrylate, 2-(n-propoxy)propyl (meth)acrylate, 2-(n-butoxy)propyl (meth)acrylate, cyclohexyl (meth)acrylate, dicyclopentanyl (meth)acrylate, and isobornyl (meth)acrylate.

[9] The electroconductive paste according to any one of [1] to [8], in which the crosslinked resin particles (C) are at least one selected from the group consisting of an acrylic crosslinked resin particle and a urethane crosslinked resin particle, the urethane crosslinked resin particles contain a polymer obtained by polymerizing a polyol and a polyisocyanate, the polyol is at least one selected from the group consisting of ethylene glycol, propylene glycol, 1,3-propanediol, 1,4-butanediol, 1,3-butanediol, 1,5-pentanediol, neopentyl glycol, 1,6-hexanediol, 3-methyl-1,5-pentanediol, 1,4-bis(hydroxymethyl)cyclohexane, bisphenol A, hydrogenated bisphenol A, hydroxybivalyl hydroxypivalate, trimethylolethane, trimethylolpropane, 2,2,4-trimethyl-1,3-pentanediol, glycerin, and hexanetriol, and the polyisocyanate is at least one selected from the group consisting of hexamethylene diisocyanate (HDI), diphenylmethane diisocyanate (MDI), isophorone diisocyanate (IPDI), blocked isocyanate in which hexamethylene diisocyanate (HDI) is masked with a blocking agent, blocked isocyanate in which diphenylmethane diisocyanate (MDI) is masked with a blocking agent, and blocked isocyanate in which isophorone diisocyanate (IPDI) is masked with a blocking agent.

[10] The electroconductive paste according to any one of [1] to [9], in which the silver powder (B) is spherical or amorphous.

[11] The electroconductive paste according to any one of [1] to [10], in which the organic solvent (D) is at least one selected from the group consisting of butyl carbitol acetate, ethyl acetate, butyl acetate, ethyl cellosolve, butyl cellosolve, ethyl carbitol, butyl carbitol, isopropanol, butanol, terpineol, texanol, butyl cellosolve acetate, and isophorone.

[12] The electroconductive paste according to any one of [1] to [11], in which a particle size of the silver powder (B) is preferably 7 μm or less, more preferably 3 to 7 μm, and even more preferably 3 to 6 μm.

[13] The electroconductive paste according to any one of [1] to [12], in which an average particle size of the crosslinked resin particles (C) is preferably 1 to 20 μm, and more preferably 3 to 15 μm.

[14] The electroconductive paste according to any one of [1] to [13], in which a content of the binder resin (A) is preferably 5 to 20 mass %, more preferably 10 to 18 mass %, and even more preferably 15 to 18 mass % with respect to a total mass of the electroconductive paste.

[15] The electroconductive paste according to any one of [1] to [14], in which the binder resin (A) contains a polyol compound (A1), and a content of the polyol compound (A1) is preferably 5 to 15 mass %, and more preferably 7 to 11 mass % with respect to a total mass of the electroconductive paste.

[16] The electroconductive paste according to any one of [1] to [15], in which the binder resin (A) contains a polyisocyanate (A2), and a content of the polyisocyanate (A2) is preferably 3 to 10 mass %, more preferably 5 to 9 mass %, and even more preferably 6 to 9 mass % with respect to a total mass of the electroconductive paste.

[17] The electroconductive paste according to any one of [1] to [16], in which the binder resin (A) contains a polyester resin (A3), and a content of the polyester resin (A3) is preferably 1 to 10 mass %, and more preferably 2 to 5 mass % with respect to a total mass of the electroconductive paste.

[18] The electroconductive paste according to any one of [1] to [17], in which a content of the silver powder (B) is preferably 50 to 80 mass %, and more preferably 60 to 70 mass % with respect to a total mass of the electroconductive paste.

[19] The electroconductive paste according to any one of [1] to [18], in which a content of the crosslinked resin particles (C) is preferably 1 to 10 mass %, more preferably 2 to 8 mass %, and even more preferably 3 to 5 mass % with respect to a total mass of the electroconductive paste.

[20] The electroconductive paste according to any one of [1] to [19], in which a content of the organic solvent (D) is preferably 5 to 20 mass %, more preferably 8 to 18 mass %, and even more preferably 10 to 16 mass % with respect to a total mass of the electroconductive paste.

[21] The electroconductive paste according to any one of [1] to [20], in which a mass ratio represented by [content of binder (A)]/[content of silver powder (B)] is preferably 0.1 to 1, and more preferably 0.2 to 0.5.

[22] The electroconductive paste according to any one of [1] to [21], in which a mass ratio represented by [content of binder (A)]/[content of crosslinked resin particles (C)] is preferably 1 to 10, and more preferably 3 to 5.

[23] The electroconductive paste according to any one of [1] to [22], in which a mass ratio represented by [content of silver powder (B)]/[content of crosslinked resin particles (C)] is preferably 10 to 30, and more preferably 15 to 20.

[24] The electroconductive paste according to any one of [1] to [23], in which a mass ratio represented by [content of binder (A)]/[content of organic solvent (D)] is preferably 0.5 to 2.0, and more preferably 0.7 to 1.8.

[25] The electroconductive paste according to any one of [1] to [24], in which a mass ratio represented by [content of silver powder (B)]/[content of organic solvent (D)] is preferably 1 to 10, and more preferably 3 to 7.

[26] The electroconductive paste according to any one of [1] to [25], in which a mass ratio represented by [content of crosslinked resin particles (C)]/[content of organic solvent (D)] is preferably 1 to 10, and more preferably 3 to 7.

Advantageous Effects of Invention

According to the present invention, it is possible to provide an electroconductive paste capable of forming a circuit by screen printing and having excellent expansion and contraction durability in a single layer.

DESCRIPTION OF EMBODIMENTS

Embodiments of an electroconductive paste according to the present invention will be described.

The embodiments will be specifically described for better understanding of the gist of the present invention, and do not limit the present invention unless otherwise specified.

[Electroconductive Paste]

An electroconductive paste according to this embodiment contains a binder (A), a silver powder (B), crosslinked resin particles (C) having a glass transition temperature of 35° C. or lower, and an organic solvent (D).

In this specification, the term "paste" means a state of a fluid having reduced fluidity due to the presence of the silver powder (B) dispersed in the organic solvent (D).

"Binder (A)"

The binder (A) is not particularly limited as long as it acts as a binder resin of the electroconductive paste, and examples thereof include a combination of a polyol compound and a polyisocyanate (that is, a urethane resin binder), a polyester-based resin, a phenoxy resin, a polyamide resin, a polyamidoimide resin, a polyimide resin, a polyurethane resin, an acrylic resin, polystyrene, a styrene-acrylic resin, a styrene-butadiene copolymer, an epoxy resin, a phenol resin, a polyether-based resin, a polycarbonate-based resin, an alkyd resin, a polysulfone resin, a polyether sulfone resin, a vinyl chloride-vinyl acetate copolymer resin, an ethylene-vinyl acetate copolymer, a silicone resin, and a fluororesin. These resins may be used alone or in combination of two or more thereof.

Among these, the binder (A) preferably contains a polyol compound (A1) and a polyisocyanate (A2) from the viewpoint of flexibility and expansion and contraction durability.

A blending ratio (A2/A1) of the polyisocyanate (A2) to the polyol compound (A1) in the binder (A) is a molar ratio of an isocyanate group (—NCO) of the polyisocyanate (A2) to a hydroxyl group of the polyol compound (A1), and is preferably 1/1 to 2/1.

In a case where the blending ratio (A2/A1) is within the above numerical range, excellent expansion and contraction durability is obtained.

"Polyol Compound (A1)"

The polyol compound (A1) is not particularly limited as long as it has two or more hydroxyl groups (—OH) which react with the isocyanate group (—NCO) of the polyisocyanate (A2), and the hydroxyl groups react with the isocyanate group to form a polyurethane resin. Examples of the polyol compound (A1) include polyester polyol, polyether polyol, polycarbonate polyol, and polycaprolactone polyol. Among these, polyester polyol is preferable.

The polyester polyol is obtained by cocondensation of one or more types of polyhydric alcohols with a polycarboxylic acid.

Examples of the polyhydric alcohols include ethylene glycol, propylene glycol, 1,3-propanediol, 1,4-butanediol, 1,3-butanediol, 1,5-pentanediol, neopentyl glycol, 1,6-hexanediol, 3-methyl-1,5-pentanediol, 1,4-bis(hydroxymethyl)cyclohexane, bisphenol A, hydrogenated bisphenol A, hydroxybivalyl hydroxypivalate, trimethylolethane, trimethylolpropane, 2,2,4-trimethyl-1,3-pentanediol, glycerin, and hexanetriol.

Examples of the polycarboxylic acid include a succinic acid, an adipic acid, a sebacic acid, an azelaic acid, a phthalic acid, a tetrahydrophthalic acid, a hexahydrophthalic acid, a maleic acid, a fumaric acid, a citraconic acid, an itaconic acid, a glutaconic acid, a 1,2,5-hexanetricarboxylic acid, a 1,4-cyclohexanedicarboxylic acid, a 1,2,4-benzenetricarboxylic acid, a 1,2,5-benzenetricarboxylic acid, a 1,2,4-cyclohexatricarboxylic acid, and a 2,5,7-naphthalentricarboxylic acid. The polyol compounds (A1) may be used alone or in combination of two or more thereof.

A weight average molecular weight (Mw) of the polyol compound (A1) is preferably 500 to 6,000, and more preferably 1,000 to 6,000.

In a case where the weight average molecular weight (Mw) of the polyol compound (A1) is 500 or greater, a coating film formed by the electroconductive paste according to this embodiment has excellent flexibility and expansion and contraction durability. In a case where the weight average molecular weight (Mw) of the polyol compound (A1) is 6,000 or less, a coating film formed by the electroconductive paste according to this embodiment has excellent expansion and contraction durability. That is, the coating film formed by the electroconductive paste according to this embodiment is excellent in returning (contraction) property to original condition (original length) in a case where, for example, a tensile force is released after pulling and stretching of the coating film in a longitudinal direction.

The weight average molecular weight (Mw) of the polyol compound (A1) is measured by gel permeation chromatography (GPC).

A hydroxyl value of the polyol compound (A1) is preferably 18.7 mgKOH/g to 336.7 mgKOH/g, and more preferably 18.7 mgKOH/g to 168.7 mgKOH/g.

In a case where the hydroxyl value of the polyol compound (A1) is 18.7 mgKOH/g or greater, a coating film formed by the electroconductive paste according to this embodiment has excellent flexibility and expansion and contraction durability. In a case where the hydroxyl value of the polyol compound (A1) is 336.7 mgKOH/g or less, a coating film formed by the electroconductive paste according to this embodiment has excellent expansion and contraction durability.

The hydroxyl value of the polyol compound (A1) is measured by a method according to JIS K0070 "Test methods for acid value, saponification value, ester value, iodine value, hydroxyl value, and unsaponifiable matter".

"Polyisocyanate (A2)" The polyisocyanate (A2) is a compound having two or more isocyanate groups in the molecule. Examples of the isocyanate compound constituting the polyisocyanate (A2) include aliphatic isocyanates and aromatic isocyanates.

Examples of the aliphatic isocyanates include hexamethylene diisocyanate, 2,4-diisocyanate-1,1-methylcyclohexane, diisocyanate cyclobutane, tetramethylene diisocyanate, o-, m-, or p-xylene diisocyanate, hydrogenated xylylene diisocyanate, dicyclohexylmethane diisocyanate, dimethyldicyclohexylmethane diisocyanate, lysine diisocyanate, cyclohexane diisocyanate, dodecane diisocyanate, tetramethylxylene diisocyanate, and isophorone diisocyanate.

Examples of the aromatic isocyanates include tolylene-2,4-diisocyanate, tolylene-2,6-diisocyanate, diphenylmethane-4,4'-diisocyanate, 3-methyldiphenylmethane-4,4'-diisocyanate, m- or p-phenylene diisocyanate, chlorophenylene-2,4-diisocyanate, naphthalene-1,5-diisocyanate, diphenyl-4,4'-diisocyanate, 3,3'-dimethyldiphenyl-1,3,5-triisopropylbenzene-2,4-diisocyanate carbodiimide-modified diphenylmetadiisocyanate, polyphenylpolymethylene isocyanate, and diphenyl ether diisocyanate.

Among these, hexamethylene diisocyanate (HDI), diphenylmethane diisocyanate (MDI), isophorone diisocyanate (IPDI), and the like are preferable. These isocyanate compounds may be used alone or in combination of two or more thereof.

In a case where a one-component electroconductive paste is selected from the viewpoint of workability in handling the electroconductive paste, a blocked isocyanate in which the isocyanate group of the isocyanate compound is masked with a blocking agent to suppress the reaction is more preferably used in order to improve storage stability and a pot life. The blocking agent preferably has a dissociation temperature (a temperature at which the isocyanate compound dissociates from the isocyanate group) of 90° C. to 130° C. Examples of such a blocking agent include polypropylene glycol, methyl ethyl ketoxime (MEKO), and diethyl malonate (DEM). The blocking agents may be used alone or in combination of two or more thereof. Among these, 1,6-hexamethylene diisocyanate blocked with polyproplene glycol is preferable.

As the polyisocyanate (A2), a commercially available product may be used.

"Polyester Resin (A3)"

The binder (A) may further contain a polyester resin (A3). Due to the polyester resin (A3) contained, the printing property during screen printing is further improved. The polyester resin (A3) does not contain a compound corresponding to the polyol compound (A1) or the polyisocyanate (A2).

The polyester resin (A3) is obtained by reacting a dicarboxylic acid with a diol compound.

Examples of the dicarboxylic acid include a succinic acid, an adipic acid, an azelaic acid, a sebacic acid, a dodecanedioic acid, a maleic acid, a fumaric acid, a glutaric acid, a hexachloroheptanedicarboxylic acid, a cyclohexanedicarboxylic acid, a phthalic acid, a hexahydrophthalic acid, an isophthalic acid, a 4-sulfoisophthalic acid, a 5-sulfoisophthalic acid, a 5-sulfoisophthalic acid sodium salt, a terephthalic acid, a tetrahydrophthalic acid, a tetrachlorophthalic acid, a 2,6-naphthalenedicarboxylic acid, a 2,7-naphthalenedicarboxylic acid, and a 2,3-naphthalenedicarboxylic acid. These may be used alone or as a mixture of two or more thereof.

Examples of the diol compound include $C_2$-$C_{22}$ alkane diols such as ethylene glycol, propylene glycol, trimethylene glycol, 1,4-butylene glycol, 1,3-butylene glycol, 1,2-butylene glycol, 1,5-pentanediol, 3-methyl-1,5-pentanediol, 2,2-dimethyl-1,3-propanediol, neopentyl glycol, 1,6-hexanediol, 2,2-diethyl-1,3-propanediol, 3,3-dimethylol heptane, 2-ethyl-2-butyl-1,3-propanediol, 1,12-dodecanediol, and 1,18-octadecanediol, aliphatic diols such as 2-butene-1,4-diol and 2,6-dimethyl-1-octene-3,8-diol; and alicyclic diols such as 1,4-cyclohexanediol and 1,4-cyclohexanedimethanol. These may be used alone or as a mixture of two or more thereof.

The polyester resin (A3) is not particularly limited as long as it is a polyester resin having a glass transition temperature (Tg) of room temperature (23° C.) or lower. Examples of the polyester resin (A3) include UE-3510 (trade name, Tg=−25° C.), UE-3400 (trade name, Tg=−20° C.), UE-3220 (trade name, Tg=5° C.), and UE-3500 (trade name, Tg=15° C.) manufactured by UNITIKA LTD. The polyester resins (A3) may be used alone or in combination of two or more thereof.

In a case where the polyester resin (A3) is contained in the electroconductive paste according to this embodiment, the content thereof is preferably 5 parts by mass to 200 parts by mass, and more preferably 20 parts by mass to 50 parts by mass with respect to 100 parts by mass of the polyol compound (A1).

A number average molecular weight (Mn) of the polyester resin (A3) is preferably 15,000 to 35,000.

In a case where the number average molecular weight (Mn) of the polyester resin (A3) is within the above numerical range, the printing property is further improved.

The number average molecular weight (Mn) of the polyester resin (A3) is measured by gel permeation chromatography (GPC).

The content of the binder resin (A) is preferably 5 to 25 mass %, and more preferably 10 to 20 mass % with respect to the total mass of the electroconductive paste. In a case where the content of the binder resin (A) is within the above range, the flexibility of a coating film formed by applying the electroconductive paste to a resin sheet and the adhesion of the coating film to the resin sheet can be further improved.

In a case where the binder resin (A) contains the polyol compound (A1), the content of the polyol compound (A1) is preferably 5 to 15 mass %, and more preferably 7 to 11 mass % with respect to the total mass of the electroconductive paste. In a case where the content of the polyol compound (A1) is within the above range, the flexibility of a coating film formed by applying the electroconductive paste to a resin sheet and the adhesion of the coating film to the resin sheet can be further improved.

In a case where the binder resin (A) contains the polyisocyanate (A2), the content of the polyisocyanate (A2) is preferably 3 to 10 mass %, more preferably 5 to 9 mass %, and even more preferably 6 to 9 mass % with respect to the total mass of the electroconductive paste. In a case where the content of the polyisocyanate (A2) is within the above range, the flexibility of a coating film formed by applying the electroconductive paste to a resin sheet and the adhesion of the coating film to the resin sheet can be further improved.

In a case where the binder resin (A) contains the polyester resin (A3), the content of the polyester resin (A3) is preferably 1 to 10 mass %, and more preferably 2 to 5 mass % with respect to the total mass of the electroconductive paste. In a case where the content of the polyester resin (A3) is within the above range, the flexibility of a coating film formed by applying the electroconductive paste to a resin sheet and the adhesion of the coating film to the resin sheet can be further improved.

"Silver Powder (B)"

The silver powder (B) is not particularly limited as long as it is a known material used for the electroconductive paste, but a spherical or amorphous silver powder is more preferable from the viewpoint of the fact that in a case where a coating film formed by the electroconductive paste according to this embodiment repeatedly expands and contracts, many conduction points (contact points) are generated between silver powder particles.

From the viewpoint of printing property, a particle size ($D_{50}$) of the silver powder (B) is preferably 7 μm or less, more preferably 3 to 7 μm, and even more preferably 3 to 6 μm. In a case where the particle size ($D_{50}$) of the silver powder (B) is within the above range, the conductivity of a coating film formed from the electroconductive paste can be improved.

The particle size ($D_{50}$) is a particle size (median size) at which a cumulative volume percentage in volume particle size distribution is 50 vol %.

The volume particle size distribution of the silver powder (B) is measured by a method according to JIS Z8825 "Particle size analysis-laser diffraction and scattering method".

The content of the silver powder (B) is preferably 50 to 80 mass %, and more preferably 60 to 70 mass % with respect to the total mass of the electroconductive paste. In a case where the content of the silver powder (B) is within the above range, the conductivity of a coating film formed from the electroconductive paste can be improved.

A mass ratio represented by [content of binder (A)]/[content of silver powder (B)] is preferably 0.1 to 1, and more preferably 0.2 to 0.5. In a case where the mass ratio is within the above range, both the flexibility and the conductivity of a coating film formed from the electroconductive paste are easily achieved.

"Crosslinked Resin Particles (C)"

The most distinctive characteristic of the electroconductive paste according to this embodiment is that the paste contains crosslinked resin particles (C) having a glass transition temperature (Tg) of 35° C. or lower. It is thought that the crosslinked resin particles (C) having the glass transition temperature relax the expansion and contraction stress in a coating film during expansion and contraction of the coating film, thereby suppressing the expansion and contraction deterioration of the coating film. In addition, it is thought that the crosslinked resin particles (C) occupy a limited space inside the coating film, and thus many conduction points of the silver powder (B) are easily generated locally even in a case where the coating film is in an expansion or contraction state. As a result, it is thought that the expansion and contraction durability is improved.

Since the paste contains an organic solvent (D), crosslinked resin particles are preferable rather than non-crosslinked particles from the viewpoint of solvent resistance.

As the crosslinked resin particles (C), crosslinked resin particles having a glass transition temperature (Tg) of −55° C. to 35° C. are more preferable. In a case where the glass transition temperature is within the above range, more excellent expansion and contraction durability is obtained. As the crosslinked resin particles having a glass transition temperature within the above range, at least one selected from the group consisting of an acrylic crosslinked resin particle and a urethane crosslinked resin particle is preferably used.

The acrylic crosslinked resin particles are obtained by polymerizing a monomer component containing an acrylic monomer in the presence of a crosslinking agent.

Examples of the crosslinking agent include those having a plurality of radically polymerizable double bonds in the molecule, and specific examples thereof include (meth)acrylic monomers and styrene-based monomers having a plurality of radically polymerizable double bonds in the molecule.

Examples of such a crosslinking agent include polyfunctional (meth)acrylates such as trimethylolpropane triacrylate, ethylene glycol dimethacrylate, diethylene glycol dimethacrylate, triethylene glycol dimethacrylate, decaethylene glycol dimethacrylate, pentadecaethylene glycol dimethacrylate, pentacontaheptaethylene glycol dimethacrylate, 1,3-butylene dimethacrylate, allyl methacrylate, trimethylolpropane trimethacrylate, and pentaerythritol tetraacrylate; aromatic divinyl compounds such as divinylbenzene, divinylnaphthalene, and derivatives thereof; N,N-divinylaniline; divinyl ether; divinyl sulfide; divinyl sulfonic acid; polybutadiene; and polyisoprene unsaturated polyester.

Examples of the acrylic monomer include monofunctional (meth)acrylates, and specific examples thereof include alkyl (meth)acrylates such as methyl (meth)acrylate, ethyl (meth)acrylate, propyl (meth)acrylate, butyl (meth)acrylate, pentyl (meth)acrylate, hexyl (meth)acrylate, heptyl (meth)acrylate, and octyl (meth)acrylate; alkoxyalkyl (meth)acrylates such as 2-methoxyethyl (meth)acrylate, 2-ethoxyethyl (meth)acrylate, 2-(n-propoxy)ethyl (meth)acrylate, 2-(n-butoxy)ethyl (meth)acrylate, 3-methoxypropyl (meth)acrylate, 3-ethoxypropyl (meth)acrylate, 2-(n-propoxy)propyl (meth)acrylate, and 2-(n-butoxy)propyl (meth)acrylate; and (meth)acrylates having an alicyclic structure such as cyclohexyl (meth)acrylate, dicyclopentanyl (meth)acrylate, and isobornyl (meth)acrylate.

Among these, those containing a polymer including a constituent unit derived from trimethylolpropane triacrylate and a constituent unit derived from butyl acrylate are preferable as the acrylic crosslinked resin particles.

In the acrylic crosslinked resin particles, a mass ratio represented by [constituent unit derived from crosslinking agent]: [constituent unit derived from acrylic monomer] is preferably 1:99 to 10:90, and more preferably 1:99 to 5:95.

The urethane crosslinked resin particles are obtained by polymerizing a bead raw material including at least one selected from the group consisting of a self-emulsifying isocyanate having two or more isocyanate groups and a hydrophilic group and a first terminal isocyanate group prepolymer obtained by reacting the self-emulsifying isocyanate with a polyol.

Examples of the self-emulsifying isocyanate include compounds in which a hydrophilic group (for example, a hydroxy group, a carboxy group, and the like) is introduced into a polyisocyanate polymer formed from an aliphatic diisocyanate and having any one structure formed of the group consisting of burette, isocyanurate, urethane, uretdione, and allophanate in the molecule.

Examples of the aliphatic diisocyanate include those described as examples of the polyisocyanate (A2).

Examples of the polyol include those described as examples of the polyol compound (A1).

An average particle size of the crosslinked resin particles (C) is preferably 1 to 20 µm, and more preferably 3 µm to 15 µm from the viewpoint of expansion and contraction durability.

Here, the average particle size is a particle size (median size) at which a cumulative volume percentage in volume particle size distribution is 50 vol %.

The volume particle size distribution of the crosslinked resin particles (C) is measured by a method according to JIS Z8825 "Particle size analysis-laser diffraction and scattering method".

In the electroconductive paste according to this embodiment, the content of the crosslinked resin particles (C) is preferably 3.0 parts by mass to 8.0 parts by mass with respect to 100 parts by mass of the solid content of the electroconductive paste excluding the crosslinked resin particles (C).

In a case where the content of the crosslinked resin particles (C) is less than 3.0 parts by mass, the expansion and contraction durability may deteriorate. In a case where the content of the crosslinked resin particles (C) is greater than 8.0 parts by mass, a coating film may be cracked.

The content of the crosslinked resin particles (C) is preferably 1 to 10 mass %, more preferably 2 to 8 mass %, and even more preferably 3 to 5 mass % with respect to the total mass of the electroconductive paste. In a case where the content of the crosslinked resin particles (C) is within the above range, the expansion and contraction durability is easily improved, and cracking of a coating film is easily suppressed.

A mass ratio represented by [content of binder (A)]/[content of crosslinked resin particles (C)] is preferably 1 to 10, and more preferably 3 to 5.

A mass ratio represented by [content of silver powder (B)]/[content of crosslinked resin particles (C)] is preferably 10 to 30, and more preferably 15 to 20. In a case where the mass ratio is within the above range, both the flexibility and the conductivity of a coating film formed from the electroconductive paste are easily achieved.

"Organic Solvent (D)"

The organic solvent (D) is not particularly limited as long as it is a known organic solvent used for a general electroconductive paste (containing conductive particles and a binder resin). Examples of the organic solvent (D) include butyl carbitol acetate, ethyl acetate, butyl acetate, ethyl cellosolve, butyl cellosolve, ethyl carbitol, butyl carbitol, isopropanol, butanol, terpineol, texanol, butyl cellosolve acetate, and isophorone. Among these, terpineol and isophorone are preferable.

In the electroconductive paste according to this embodiment, the content of the organic solvent (D) is not particularly limited as long as the printability in printing of the electroconductive paste on an object can be secured by screen printing. The content of the organic solvent (D) is preferably adjusted so that the content of non-volatile matter (components other than the organic solvent (D)) of the electroconductive paste is 70 mass % to 90 mass % with respect to the total mass of the electroconductive paste.

The content of the organic solvent (D) is preferably 5 to 20 mass %, more preferably 8 to 18 mass %, and even more preferably 10 to 16 mass % with respect to the total mass of the electroconductive paste. In a case where the content of the organic solvent (D) is within the above range, the handleability of the electroconductive paste can be improved.

A mass ratio represented by [content of binder (A)]/[content of organic solvent (D)] is preferably 0.5 to 2.0, and more preferably 0.7 to 1.8. In a case where the mass ratio is within the above range, the handleability of the electroconductive paste can be improved.

A mass ratio represented by [content of silver powder (B)]/[content of organic solvent (D)] is preferably 1 to 10, and more preferably 3 to 7. In a case where the mass ratio is within the above range, the silver powder (B) can be uniformly dispersed in the electroconductive paste, whereby a coating film in which the silver powder (B) is uniformly dispersed can be formed.

A mass ratio represented by [content of crosslinked resin particles (C)]/[content of organic solvent (D)] is preferably 1 to 10, and more preferably 3 to 7. In a case where the mass ratio is within the above range, the crosslinked resin particles (C) can be uniformly dispersed in the electroconductive paste, whereby a coating film in which the crosslinked resin particles (C) are uniformly dispersed can be formed.

"Other Components"

The electroconductive paste according to this embodiment may contain components (other components) other than the binder (A), the silver powder (B), the crosslinked resin particles (C), and the organic solvent (D).

Examples of other components include additives for coating such as dispersants, surface conditioners, and thixotropic agents.

The electroconductive paste according to the present invention preferably essentially contains no water.

A water content is preferably 1 mass % or less, more preferably 0.5 mass % or less, and even more preferably 0.1 mass % or less with respect to the total mass of the electroconductive paste. In a case where the water content is within the above range, a paste suitable for screen printing can be obtained.

The total content of the components (A) to (D) is not greater than 100 mass % with respect to the total mass of the electroconductive paste.

"Method of Manufacturing Electroconductive Paste"

The electroconductive paste according to this embodiment is obtained by mixing the binder (A), the silver powder (B), the crosslinked resin particles (C), the organic solvent (D), and other optional components described above.

For example, a mixer such as a roll mill or a planetary mixer may be used for mixing.

According to the electroconductive paste according to this embodiment, since the binder (A), the silver powder (B), the crosslinked resin particles (C) having a glass transition temperature (Tg) of 35° C. or lower, and the organic solvent (D) are contained, an electroconductive paste capable of forming a coating film having excellent flexibility and expansion and contraction durability can be obtained.

In addition, according to the electroconductive paste according to this embodiment, it is possible to form a coating film having excellent expansion and contraction durability. Here, the expansion and contraction durability is a property that in a case where, for example, a coating film formed by the electroconductive paste is pulled and expanded in a longitudinal direction, and then returned to its original condition (original length) by releasing the tensile force, and this operation is repeatedly performed, the electric resistance value of the coating film is hard to change (the electric resistance value is hard to increase).

Specifically, it can be said that the smaller the value of ([electric resistance value at N-th expansion and contraction]-[electric resistance value before expansion and contraction])/[electric resistance value before expansion and contraction]×100(%), the more excellent expansion and contraction durability of the coating film. For example, an electrode is connected to both ends of the coating film in the longitudinal direction, and an electric resistance value of the coating film is measured using a resistivity meter.

"Use"

The electroconductive paste according to the present invention is suitable for applications requiring flexibility. For example, it is suitable for circuit formation in the field of wearable devices represented by smart wear and other medical and caring fields requiring bendability, foldability, and stretchability.

EXAMPLES

Hereinafter, the present invention will be described in greater detail with examples and comparative examples, but is not limited to the following examples.

(Manufacturing of Electroconductive Paste)

Table 1 shows compositions of electroconductive pastes used in the present invention.

Manufacturing Example 1

12.0 parts by mass of polyester polyol ("P2010" (weight average molecular weight: 2,000, hydroxyl value: 56.1) manufactured by Kuraray Co., Ltd.) as a polyol compound (A1), 10.0 parts by mass of polypropylene glycol (PPG)-modified 1,6-hexamethylene diisocyanate blocked product ("E402-B80B" (solid content: 80 mass %, theoretical isocyanate value: 6.0 mass %) manufactured by Asahi Kasei Co., Ltd.) as polyisocyanate (A2), 80.0 parts by mass of "Silver Powder SPS" ($D_{50}$=3.0 μm, amorphous silver powder) manufactured by Ames Advanced Materials Corporation as a silver powder (B), 5.0 parts by mass of urethane crosslinked resin particles "Art Pearl C-800" (average particle size: 6 μm, glass transition point: −13° C.) manufactured by Negami Chemical Industrial Co., Ltd. as crosslinked resin particles (C), and 18.0 parts by mass of terpineol as an organic solvent (D) were kneaded with a three-roll mill, and an electroconductive paste of Manufacturing Example 1 was manufactured.

Manufacturing Examples 2 to 12

Electroconductive pastes of Manufacturing Examples 2 to 12 were also manufactured in the same manner as in Manufacturing Example 1 according to the composition shown in Table 1. In Table 1, the unit of the numerical value is "parts by mass". Table 2 shows the values obtained by converting "parts by mass" into "mass %".

As shown in Table 1, as the polyester resin (A3), "UE-3400" (number average molecular weight: 25,000, glass transition temperature: −20° C.) manufactured by UNITIKA LTD. was used.

As the silver powder (B), "SF-70M" ($D_{50}$=2.0 µm, flaky silver powder) manufactured by Ames Advanced Materials Corporation was also used. As the crosslinked resin particles (C), "Art Pearl JB-800T" manufactured by Negami Chemical Industrial Co., Ltd. (average particle size: 6 µm, glass transition point: −54° C.), "Art Pearl C-1000" (average particle size: 3 µm, glass transition point: −13° C.) manufactured by Negami Chemical Industrial Co., Ltd., "Art Pearl C-400" (average particle size: 15 µm, glass transition point: −13° C.) manufactured by Negami Chemical Industrial Co., Ltd., and "Art Pearl U-600T" (average particle size: 10 µm, glass transition point: 35° C.) manufactured by Negami Chemical Industrial Co., Ltd. were also used.

Regarding acrylic crosslinked resin particles A to D shown in Table 1, the resin particles were manufactured according to the following.

"Acrylic Crosslinked Resin Particles A"

98 parts by mass of n-butyl acrylate and 2 parts by mass of trimethylolpropane triacrylate as a crosslinking agent were mixed, and 0.25 parts by mass of lauroyl peroxide as a polymerization initiator was dissolved to prepare a monomer mixed liquid.

Separately, 380 parts by mass of water, 5 parts by mass of calcium tertiary phosphate as a dispersion stabilizer, and 0.05 parts by mass of sodium dodecylbenzenesulfonate as an emulsifier were put into a 2 L beaker and mixed. The monomer mixed liquid prepared as above was added thereto and suspended by a disperser. The resulting material was transferred to a 2 L four-neck flask provided with a cooling condenser and a thermometer to cause a reaction for 2 hours while maintaining the temperature inside the flask at 80° C.

After the polymerization, the calcium tertiary phosphate was decomposed by a nitric acid, and the obtained particle slurry was washed, filtered, and dried to obtain acrylic crosslinked resin particles A having an average particle size of 9 µm and a glass transition temperature of −46° C.

"Acrylic Crosslinked Resin Particles B"

40 parts by mass of n-butyl acrylate, 58 parts by mass of butyl methacrylate, and 2 parts by mass of trimethylolpropane triacrylate as a crosslinking agent were mixed, and 0.25 parts by mass of lauroyl peroxide as a polymerization initiator was dissolved to prepare a monomer mixed liquid.

Separately, 380 parts by mass of water, 5 parts by mass of calcium tertiary phosphate as a dispersion stabilizer, and 0.05 parts by mass of sodium dodecylbenzenesulfonate as an emulsifier were put into a 2 L beaker and mixed. The monomer mixed liquid prepared as above was added thereto and suspended by a disperser. The resulting material was transferred to a 2 L four-neck flask provided with a cooling condenser and a thermometer to cause a reaction for 2 hours while maintaining the temperature inside the flask at 80° C.

After the polymerization, the calcium tertiary phosphate was decomposed by a nitric acid, and the obtained particle slurry was washed, filtered, and dried to obtain acrylic crosslinked resin particles B having an average particle size of 9 µm and a glass transition temperature of −15° C.

"Acrylic Crosslinked Resin Particles C"

10 parts by mass of n-butyl acrylate, 88 parts by mass of butyl methacrylate, and 2 parts by mass of trimethylolpropane triacrylate as a crosslinking agent were mixed, and 0.25 parts by mass of lauroyl peroxide as a polymerization initiator was dissolved to prepare a monomer mixed liquid.

Separately, 380 parts by mass of water, 5 parts by mass of calcium tertiary phosphate as a dispersion stabilizer, and 0.05 parts by mass of sodium dodecylbenzenesulfonate as an emulsifier were put into a 2 L beaker and mixed. The monomer mixed liquid prepared as above was added thereto and suspended by a disperser. The resulting material was transferred to a 2 L four-neck flask provided with a cooling condenser and a thermometer to cause a reaction for 2 hours while maintaining the temperature inside the flask at 80° C.

After the polymerization, the calcium tertiary phosphate was decomposed by a nitric acid, and the obtained particle slurry was washed, filtered, and dried to obtain acrylic crosslinked resin particles C having an average particle size of 10 µm and a glass transition temperature of 15° C.

"Acrylic Crosslinked Resin Particles D"

90 parts by mass of n-butyl acrylate and 10 parts by mass of trimethylolpropane triacrylate as a crosslinking agent were mixed, and 0.25 parts by mass of lauroyl peroxide as a polymerization initiator was dissolved to prepare a monomer mixed liquid.

Separately, 380 parts by mass of water, 5 parts by mass of calcium tertiary phosphate as a dispersion stabilizer, and 0.05 parts by mass of sodium dodecylbenzenesulfonate as an emulsifier were put into a 2 L beaker and mixed. The monomer mixed liquid prepared as above was added thereto and suspended by a disperser. The resulting material was transferred to a 2 L four-neck flask provided with a cooling condenser and a thermometer to cause a reaction for 2 hours while maintaining the temperature inside the flask at 80° C.

After the polymerization, the calcium tertiary phosphate was decomposed by a nitric acid, and the obtained particle slurry was washed, filtered, and dried to obtain acrylic crosslinked resin particles D having an average particle size of 10 µm and a glass transition temperature of 40° C.

Example 1

(Evaluation of Expansion and Contraction Durability)

The electroconductive paste of Manufacturing Example 1 was used and applied to a urethane sheet by screen printing so as to form a pattern of 1 mm width×50 mm length. Then, drying was performed at 150° C. for 30 minutes to form a wiring pattern.

Next, both ends of the wiring pattern in the longitudinal direction were connected to an electrode terminal to measure a resistance value, and fixed to a strograph (VESSD, manufactured by Toyo Seiki Seisaku-sho, Ltd.). The wiring pattern having an initial length of 50 mm was expanded to 65 mm, and then returned to the initial length of 50 mm. Such expansion and contraction was repeated 100 times, and a rate of change of the electric resistance value represented by {([electric resistance value at 100-th expansion and contraction]−[electric resistance value before expansion and contraction])/[electric resistance value before expansion and contraction]}×100(%) was calculated.

In a case where the rate of change of the electric resistance value was less than 4,000%, the expansion and contraction durability was evaluated as acceptable, and in a case where the rate of change of the electric resistance value was 4,000% or greater, the expansion and contraction durability was evaluated as unacceptable. The results are shown in Table 3.

Examples 2 to 10, Comparative Example 1, and Comparative Example 2

The expansion and contraction durability of Examples 2 to 10, Comparative Example 1, and Comparative Example 2 was evaluated in the same manner as in Example 1. The results are shown in Table 3.

TABLE 1

| | | Manufacturing Example 1 | Manufacturing Example 2 | Manufacturing Example 3 | Manufacturing Example 4 | Manufacturing Example 5 | Manufacturing Example 6 |
|---|---|---|---|---|---|---|---|
| Polyol Compound (A1) | P2010 | 12.0 | 9.5 | 12.0 | 12.0 | 12.0 | 9.0 |
| Polyisocyanate (A2) | E402-B80T | 10.0 | 8.1 | 10.0 | 10.0 | 10.0 | 7.5 |
| Polyester Resin (A3) | UE-3400 | | 4.0 | | | | |
| Silver Powder (B) | Silver Powder SPS SF-70M | 80.0 | 80.0 | 80.0 | 80.0 | 80.0 | 85.0 |
| Crosslinked Resin Particles (C) | Art Pearl C-800 | 5.0 | 5.0 | | | | 5.0 |
| | Art Pearl JB-800T | | | 5.0 | | | |
| | Art Pearl C-1000 | | | | 5.0 | | |
| | Art Pearl C-400 | | | | | 5.0 | |
| | Art Pearl U-600T | | | | | | |
| | Acrylic Crosslinked Resin Particles A | | | | | | |
| | Acrylic Crosslinked Resin Particles B | | | | | | |
| | Acrylic Crosslinked Resin Particles C | | | | | | |
| | Acrylic Crosslinked Resin Particles D | | | | | | |
| Organic Solvent (D) | Terpineol | 18.0 | 13.5 | 18.0 | 18.0 | 18.0 | 18.0 |
| | Isophorone | | 9.0 | | | | |

| | | Manufacturing Example 7 | Manufacturing Example 8 | Manufacturing Example 9 | Manufacturing Example 10 | Manufacturing Example 11 | Manufacturing Example 12 |
|---|---|---|---|---|---|---|---|
| Polyol Compound (A1) | P2010 | 12.0 | 12.0 | 12.0 | 12.0 | 12.0 | 12.0 |
| Polyisocyanate (A2) | E402-B80T | 10.0 | 10.0 | 10.0 | 10.0 | 10.0 | 10.0 |
| Polyester Resin (A3) | UE-3400 | | | | | | |
| Silver Powder (B) | Silver Powder SPS SF-70M | 80.0 | 80.0 | 80.0 | 80.0 | 80.0 | 80.0 |
| Crosslinked Resin Particles (C) | Art Pearl C-800 | | | | | | |
| | Art Pearl JB-800T | | | | | | |
| | Art Pearl C-1000 | | | | | | |
| | Art Pearl C-400 | | | | | | |
| | Art Pearl U-600T | 5.0 | | | | | |
| | Acrylic Crosslinked Resin Particles A | | 5.0 | | | | |
| | Acrylic Crosslinked Resin Particles B | | | 5.0 | | | |
| | Acrylic Crosslinked Resin Particles C | | | | 5.0 | | |
| | Acrylic Crosslinked Resin Particles D | | | | | | 5.0 |
| Organic Solvent (D) | Terpineol | 18.0 | 20.0 | 20.0 | 20.0 | 12.5 | 18.0 |
| | Isophorone | | | | | | |

TABLE 2

| | | Manufacturing Example 1 | Manufacturing Example 2 | Manufacturing Example 3 | Manufacturing Example 4 | Manufacturing Example 5 | Manufacturing Example 6 |
|---|---|---|---|---|---|---|---|
| Polyol Compound (A1) | P2010 | 9.60 | 7.36 | 9.60 | 9.60 | 9.60 | 7.20 |
| Polyisocyanate (A2) | E402-B80T | 8.00 | 6.27 | 8.00 | 8.00 | 8.00 | 6.00 |
| Polyester Resin (A3) | UE-3400 | | 3.10 | | | | |
| Silver Powder (B) | Silver Powder SPS | 64.00 | 61.97 | 64.00 | 64.00 | 64.00 | |
| | SF-70M | | | | | | 68.30 |
| Crosslinked Resin Particles (C) | Art Pearl C-800 | 4.00 | 3.87 | | | | 4.00 |
| | Art Pearl JB-800T | | | 4.00 | | | |
| | Art Pearl C-1000 | | | | 4.00 | | |
| | Art Pearl C-400 | | | | | 4.00 | |
| | Art Pearl U-600T | | | | | | |
| | Acrylic Crosslinked Resin Particles A | | | | | | |
| | Acrylic Crosslinked Resin Particles B | | | | | | |
| | Acrylic Crosslinked Resin Particles C | | | | | | |
| | Acrylic Crosslinked Resin Particles D | | | | | | |
| Organic Solvent (D) | Terpineol | 14.40 | 10.46 | 14.40 | 14.40 | 14.40 | 14.50 |
| | Isophorone | | 6.97 | | | | |
| Total | | 100 | 100 | 100 | 100 | 100 | 100 |

| | | Manufacturing Example 7 | Manufacturing Example 8 | Manufacturing Example 9 | Manufacturing Example 10 | Manufacturing Example 11 | Manufacturing Example 12 |
|---|---|---|---|---|---|---|---|
| Polyol Compound (A1) | P2010 | 9.60 | 9.45 | 9.45 | 9.45 | 10.48 | 9.60 |
| Polyisocyanate (A2) | E402-B80T | 8.00 | 7.90 | 7.90 | 7.90 | 8.73 | 8.00 |
| Polyester Resin (A3) | UE-3400 | | | | | | |
| Silver Powder (B) | Silver Powder SPS | 64.00 | 63.00 | 63.00 | 63.00 | 69.87 | 64.00 |
| | SF-70M | | | | | | |
| Crosslinked Resin Particles (C) | Art Pearl C-800 | | | | | | |
| | Art Pearl JB-800T | | | | | | |
| | Art Pearl C-1000 | | | | | | |
| | Art Pearl C-400 | | | | | | |
| | Art Pearl U-600T | 4.00 | | | | | |
| | Acrylic Crosslinked Resin Particles A | | 3.90 | | | | |
| | Acrylic Crosslinked Resin Particles B | | | 3.90 | | | |
| | Acrylic Crosslinked Resin Particles C | | | | 3.90 | | |
| | Acrylic Crosslinked Resin Particles D | | | | | | 4.00 |
| Organic Solvent (D) | Terpineol | 14.40 | 15.75 | 15.75 | 15.75 | 10.92 | 14.40 |
| | Isophorone | | | | | | |
| Total | | 100 | 100 | 100 | 100 | 100 | 100 |

TABLE 3

| | Example 1 | Example 2 | Example 3 | Example 4 | Example 5 | Example 6 |
|---|---|---|---|---|---|---|
| Electroconductive Paste | Manufacturing Example 1 | Manufacturing Example 2 | Manufacturing Example 3 | Manufacturing Example 4 | Manufacturing Example 5 | Manufacturing Example 6 |
| Rate of Change of Electric Resistance Value (%) | 1290 | 1670 | 1300 | 1310 | 1220 | 3500 |
| Evaluation of Expansion and Contraction Durability | Acceptable | Acceptable | Acceptable | Acceptable | Acceptable | Acceptable |

| | Example 7 | Example 8 | Example 9 | Example 10 | Comparative Example 1 | Comparative Example 2 |
|---|---|---|---|---|---|---|
| Electroconductive Paste | Manufacturing Example 7 | Manufacturing Example 8 | Manufacturing Example 9 | Manufacturing Example 10 | Manufacturing Example 11 | Manufacturing Example 12 |
| Rate of Change of Electric Resistance Value (%) | 1390 | 1087 | 1069 | 1032 | 4500 | 5500 |
| Evaluation of Expansion and Contraction Durability | Acceptable | Acceptable | Acceptable | Acceptable | Unacceptable | Unacceptable |

From the results in Table 3, it has been found that in comparison of the wiring patterns of Examples 1 to 10 with the wiring patterns of Comparative Examples 1 and 2, the wiring patterns of Examples 1 to 10 have excellent expansion and contraction durability. Meanwhile, it has been found that Comparative Example 1 containing no crosslinked resin particles (C) and Comparative Example 2 using the crosslinked resin particles (C) having a glass transition temperature of higher than 35° C. have poor expansion and contraction durability.

Example 13 and Comparative Example 3

(Evaluation of Flexibility)

Using the electroconductive paste of Manufacturing Example 1, a circuit pattern of 0.4 mm width×175 mm length was screen-printed on a 100 μm-thick TPU film (ESMER URS manufactured by Nihon Matai Co., Ltd.) and dried at 130° C. for 30 minutes to prepare a test piece.

Next, a circuit resistance was measured and set as an initial value $R_0$, the circuit was bent inward by 180°, and a static load of 5 kg was applied for 5 seconds by a rod-like compression gauge manufactured by OHBA KEIKI SEISAKUSHO CO., LTD.

Next, the circuit was bent outward by 180°, and a static load of 5 kg was applied for 5 seconds. This operation was set as one bending cycle, and a circuit resistance value $R_{20}$ after 20 cycles was measured. A rate of change of the resistance after 20 cycles was calculated by $\{(R_{20}-R_0)/R_0\}\times 100$. The resulting numerical value is determined as Example 13.

The electroconductive paste of Manufacturing Example 11 was also used in the same manner as in Example 13 to calculate the rate of change of the resistance after 20 cycles. The resulting numerical value is determined as Comparative Example 3.

As a result, it has been found that since Example 13 is 1.0% and Comparative Example 3 is 23%, the wiring pattern of Example 13 has a lower rate of change of the resistance and has more excellent flexibility than the wiring pattern of Comparative Example 3.

INDUSTRIAL APPLICABILITY

According to the present invention, it is possible to provide an electroconductive paste capable of forming a circuit by screen printing and forming a coating film having excellent expansion and contraction durability in a single layer.

The invention claimed is:

1. An electroconductive paste comprising:
   a binder (A);
   a silver powder (B);
   crosslinked resin particles (C) having a glass transition temperature of 35° C. or lower; and
   an organic solvent (D),
   in which a content of the binder resin (A) is 5 to 20 mass % with respect to a total mass of the electroconductive paste, and
   a content of the silver powder (B) is 50 to 80 mass % with respect to a total mass of the electroconductive paste.

2. The electroconductive paste according to claim 1, wherein the crosslinked resin particles (C) are at least one selected from the group consisting of an acrylic crosslinked resin particle and a urethane crosslinked resin particle.

3. The electroconductive paste according to claim 1, wherein the binder (A) contains a polyol compound (A1) and a polyisocyanate (A2).

4. The electroconductive paste according to claim 1, in which the binder (A) contains a polyol compound (A1) and a polyisocyanate (A2), and the polyol compound (A1) is at least one selected from the group consisting of a polyester polyol, a polyether polyol, a polycarbonate polyol, and a polycaprolactone polyol.

5. The electroconductive paste according to claim 1, in which the silver powder (B) is spherical or amorphous.

6. The electroconductive paste according to claim 1, in which a particle size of the silver powder (B) is 7 μm or less.

7. The electroconductive paste according to claim 1, in which an average particle size of the crosslinked resin particles (C) is 1 to 20 μm.

8. The electroconductive paste according to claim 1, in which the binder resin (A) contains a polyol compound (A1), and a content of the polyol compound (A1) is 5 to 15 mass % with respect to a total mass of the electroconductive paste.

9. The electroconductive paste according to claim 1, in which the binder resin (A) contains a polyisocyanate (A2), and a content of the polyisocyanate (A2) is 3 to 10 mass % with respect to a total mass of the electroconductive paste.

10. The electroconductive paste according to claim 1, in which the binder resin (A) contains a polyester resin (A3), and a content of the polyester resin (A3) is 1 to 10 mass % with respect to a total mass of the electroconductive paste.

11. The electroconductive paste according to claim 1, in which a content of the crosslinked resin particles (C) is 1 to 10 mass % with respect to a total mass of the electroconductive paste.

12. The electroconductive paste according to claim 1, in which a content of the organic solvent (D) is 5 to 20 mass % with respect to a total mass of the electroconductive paste.

13. The electroconductive paste according to claim 1, in which a mass ratio represented by [content of binder (A)]/[content of silver powder (B)] is 0.1 to 1.

14. The electroconductive paste according to claim 1, in which a mass ratio represented by [content of binder (A)]/[content of crosslinked resin particles (C)] is 1 to 10.

15. The electroconductive paste according to claim 1, in which a mass ratio represented by [content of silver powder (B)]/[content of crosslinked resin particles (C)] is 10 to 30.

16. The electroconductive paste according to claim 1, in which a mass ratio represented by [content of binder (A)]/[content of organic solvent (D)] is 0.5 to 2.0.

17. The electroconductive paste according to claim 1, in which a mass ratio represented by [content of silver powder (B)]/[content of organic solvent (D)] is 1 to 10.

18. The electroconductive paste according to claim 1, in which a mass ratio represented by [content of crosslinked resin particles (C)]/[content of organic solvent (D)] is 1 to 10.

19. The electroconductive paste according to claim 1, in which a mass ratio represented by [content of silver powder (B)]/[content of crosslinked resin particles (C)] is 10 to 17.

20. The electroconductive paste according to claim 1, in which a rate of change of an electric resistance value measured by a following measurement method is 1032 to 3500%, and wherein the measurement method includes:

applying the electroconductive paste to a urethane sheet by screen printing to form a pattern of 1 mm width×50 mm length; then, drying is performed at 150° C. for 30 minutes to form a wiring pattern; next, both ends of the wiring pattern are connected in a longitudinal direction to an electrode terminal to measure a resistance value, and fixed to a strograph; the wiring pattern having an initial length of 50 mm is expanded to 65 mm, and then returned to the initial length of 50 mm; repeating said expansion and contraction 100 times, and calculating the rate of change of the electric resistance value represented by {([electric resistance value at 100-th expansion and contraction]−[electric resistance value before expansion and contraction])/[electric resistance value before expansion and contraction]}×100(%).

* * * * *